US012672569B2

(12) United States Patent
Masuda et al.

(10) Patent No.: US 12,672,569 B2
(45) Date of Patent: Jun. 30, 2026

(54) POWER SEMICONDUCTOR MODULE AND POWER CONVERSION DEVICE

(71) Applicant: Hitachi Power Semiconductor Device, Ltd., Hitachi (JP)

(72) Inventors: Toru Masuda, Tokyo (JP); Seiichi Hayakawa, Hitachi (JP); Yuji Takayanagi, Hitachi (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 575 days.

(21) Appl. No.: 18/005,748

(22) PCT Filed: Apr. 19, 2021

(86) PCT No.: PCT/JP2021/015813
§ 371 (c)(1),
(2) Date: Jan. 17, 2023

(87) PCT Pub. No.: WO2022/038831
PCT Pub. Date: Feb. 24, 2022

(65) Prior Publication Data
US 2023/0282561 A1      Sep. 7, 2023

(30) Foreign Application Priority Data
Aug. 18, 2020      (JP) ................................. 2020-138037

(51) Int. Cl.
*H02M 7/00* (2006.01)
*H10W 70/60* (2026.01)
(Continued)

(52) U.S. Cl.
CPC ......... *H10W 70/658* (2026.01); *H02M 7/003* (2013.01); *H10W 70/611* (2026.01);
(Continued)

(58) Field of Classification Search
CPC . H01L 23/5386; H01L 25/072; H01L 23/051; H02M 7/003; H10W 70/65; H10W 76/138
See application file for complete search history.

(56) References Cited

U.S. PATENT DOCUMENTS

2013/0082373 A1*  4/2013  Duetemeyer ....... H01L 23/3735
                                                257/690
2017/0263753 A1  9/2017  Moriya et al.
(Continued)

FOREIGN PATENT DOCUMENTS

CN      109698178 A      4/2019
JP      2014-120638 A      6/2014
(Continued)

OTHER PUBLICATIONS

Notice of Reasons for Refusal, mailed Sep. 12, 2023, for Japanese Application No. 2020-138037 (with English translation).
International Search Report, mailed Jul. 13, 2021, for International Application No. PCT/JP2021/015813.
(Continued)

*Primary Examiner* — Michele Fan
(74) *Attorney, Agent, or Firm* — Baker Botts L.L.P.

(57) ABSTRACT
The provided power semiconductor module is configured to reduce the wiring inductance and save space on the substrate by establishing a multi-parallel connection between multiple power semiconductor chips. It consists of a first and second insulated substrates with a plurality of semiconductor switching elements positioned on one and facing the other. There are also first and second spacer conductors positioned between the plurality of semiconductor switching elements and the second insulated substrate. Inter-spacer-conductor wiring parts are connected with the plurality of second spacer conductors. Each of the plurality of semiconductor switching elements has a first electrode connected to a conductor layer on the first substrate, a second electrode connected to a conductor on the second substrate via the first
(Continued)

spacer conductors, and a control electrode connected to each other through the second spacer conductors and the inter-spacer-conductor wiring parts which are positioned a prescribed distance from the second conductor layer.

10 Claims, 13 Drawing Sheets

(51) Int. Cl.
_H10W 70/65_ (2026.01)
_H10W 90/00_ (2026.01)
_H10W 72/00_ (2026.01)

(52) U.S. Cl.
CPC ........... _H10W 70/65_ (2026.01); _H10W 90/00_ (2026.01); _H10W 90/401_ (2026.01); _H10W 90/701_ (2026.01); _H10W 72/865_ (2026.01); _H10W 72/884_ (2026.01); _H10W 90/734_ (2026.01); _H10W 90/736_ (2026.01); _H10W 90/754_ (2026.01)

(56) References Cited

U.S. PATENT DOCUMENTS

| | | | |
|---|---|---|---|
| 2017/0338162 A1 | 11/2017 | Cottet et al. | |
| 2018/0277508 A1* | 9/2018 | Okuda ................... | H01L 24/72 |
| 2019/0122970 A1* | 4/2019 | Teysseyre .......... | H01L 23/3735 |
| 2019/0221521 A1* | 7/2019 | Hohlfeld ................ | H01L 25/50 |
| 2020/0266727 A1* | 8/2020 | Tsuchimochi ...... | H01L 23/3735 |

FOREIGN PATENT DOCUMENTS

| | | | | | |
|---|---|---|---|---|---|
| JP | 2016-066974 | A | 4/2016 | | |
| JP | 2017-163107 | A | 9/2017 | | |
| JP | 2017-208547 | A | 11/2017 | | |
| JP | 2020-087986 | A | 6/2020 | | |
| WO | WO-2015128975 | A1 * | 9/2015 | ............ | H01L 25/18 |
| WO | WO 2018/043535 | A1 | 3/2018 | | |

OTHER PUBLICATIONS

Office Action and Search Report dated Mar. 16, 2026 for Chinese Patent Application No. 202180057429.2 (with English translation).

* cited by examiner

A-A'

A-A'

$$K_{A-B} = -0.83$$

$$K\,A'-B' = -0.68$$

A-A'

A-A'

POWER SEMICONDUCTOR MODULE AND POWER CONVERSION DEVICE

TECHNICAL FIELD

The present invention relates to a structure of a power semiconductor module, and particularly to an effective technique applied to the power semiconductor module where a plurality of power semiconductor chips are connected in multiple parallel on a same substrate.

BACKGROUND ART

In order to control power or motors of industrial equipment, electric railway vehicles, automobiles, home electric appliances, or others, a power semiconductor module is used as a single module including a plurality of semiconductor elements, such as a switching element (e.g., a power metal-oxide-semiconductor field-effect transistor (MOSFET) or an insulated gate bipolar transistor (IGBT), or a freewheel diodes.

In recent years, gallium nitride (GaN) or silicon carbide (SiC) is used as a material of a power semiconductor chip, and the power semiconductor chip is more advantageous than that made of silicon (Si) in higher speed switching, higher operational temperature, and others. Currently, with the power semiconductor chip of GaN or SiC having a small element size, a plurality of the power semiconductor chips need to be connected in parallel to be mounted on an insulation substrate in the power semiconductor module such that the power semiconductor module satisfies a pre-determined current capacity.

The background art in this technical field includes, for example, a technique disclosed in PTL 1. As a technique where the plurality of semiconductor elements are connected in parallel on the insulation substrate in the power semiconductor module, PTL 1 discloses a power module where a plurality of conductive patterns of different potentials are arranged on a single substrate and the plurality of conductive patterns have mirror image shapes.

PTL 2 discloses a power module where a plurality of power semiconductor elements are sandwiched between a pair (two) of module substrates (insulation substrates), and electrodes of the plurality of power semiconductor elements are electrically connected to each other through a conductive layer of the module substrate.

PTL 3 discloses a package including a plurality of semiconductor elements where, for example, gate electrodes of the plurality of semiconductor elements are commonly connected through a lead frame, and gate wiring is made longer from the lead frame through a via hole.

CITATION LIST

Patent Literature

PTL 1: JP 2017-208547 A
PTL 2: WO 2015/128975 A
PTL 3: US 2019/0,122,970 A

SUMMARY OF INVENTION

Technical Problem

In PTL 1, FIG. 1 illustrates a half-bridge circuit where semiconductor chips are arranged. In the half-bridge circuit, an inner gate contact region 46 and an outer gate contact region 48 where gate electrodes of the semiconductor switch chips are connected in parallel, are arranged on a same plane with inner metalized region 16, an intermediate metallized region 18, and an outer metallized region 20 where drain electrodes of the semiconductor chips are connected.

In FIGS. 1 and 2 of PTL 2, a plurality of semiconductor chips 6 are arranged on a lower substrate 2, and each of the plurality of semiconductor chips 6 has, on its upper surface, an electrode terminal 11 and a source electrode 36. Here, a connection member 9 is provided to commonly connect the electrode terminals 11 of the plurality of semiconductor chips 6, and a connection member 10 is provided to commonly connect the source electrodes 36 of the plurality of semiconductor chips.

The connection member 9 is configured, with a focus on a length of wiring from a chip group input terminal 8 at a center between the gate electrodes of the plurality of semiconductor chips 6 and a module input terminal 5, to regulate delay time of gate input signals of the plurality of semiconductor chips 6. With this configuration, the gate input signals are less prone to be unstable.

In FIGS. 1A and 1B of PTL 3, a plurality of semiconductor chips (dies) 10 are arranged with gate electrodes GA and GB facing downward on the drawings, and a lead frame 130-2 is connected commonly to the gate electrodes GA and GB. The lead frame 130-2 is also connected to a gate routing wiring 124 through a via wiring 126. The gate routing wiring 124 is led out from two semiconductor chip groups (10A and 10B) to be used for external connection. In a lateral direction of the lead frame 130-2, a lead frame 130-3 is arranged to be connected to a source electrode of each of the plurality of semiconductor chips 10, and the lead frame 130-2 and the lead frame 130-3 have a gap therebetween to be reliably insulated from each other. Each of the plurality of semiconductor chips 10 has a drain electrode connected to the outside through a spacer 15.

This structure results in a submodule 100 using each of the gate routing wiring 124, the lead frame 130-3 for the source electrode, and the spacer 15 for the drain electrode as an interface, so that a plurality of the submodules are easily arranged in a power semiconductor module.

However, as an example of an internal structure of a power semiconductor module, in PTL 3, two different wiring patterns are frequently separated at a distance of several mm (e.g., 1.5 mm) from each other, in accordance with specification of insulation withstand voltage. A typical example of this structure is the inner gate contact region 46 or the outer gate contact region 48 in PTL 1.

Thus, on a wiring layer of the insulation substrate, the plurality of wiring patterns are spaced from each other, thereby resulting in an increased area of the insulation substrate. Particularly, with semiconductor chips of GaN or SiC, a chip area is small and thus multiple wirings need to be arranged in parallel. This configuration increases the area for the space between the plurality of wiring patterns, leading to the increased area of the insulation substrate.

Further, the gate wiring routed in each of PTLs 1 to 3 has a low magnetic coupling to other wirings, e.g., source or drain wirings, the lead frame, or the spacer in the wiring path. In other words, the structure generates in the gate wiring an inductance in proportion to a length of the wiring path, and the gate wiring has the low magnetic coupling to the source wiring as a return path of a gate current. Consequently, the inductance generated in the gate wiring increases, and when the power semiconductor chips are switch-controlled, gate waveform is prone to be unstable.

As exemplified in PTLs 2 and 3, in the structure where the plurality of power semiconductor chips are sandwiched between the two module substrates (insulation substrates), measures are clearly disclosed to equalize the lengths of the gate wirings of the power semiconductor chips and to facilitate assembly using the submodule structure, however, a measure to reduce the areas of the substrates is not disclosed.

Further, a measure to reduce the inductance generated in the gate wiring path is not disclosed.

In view of the respects described above, an object of the present invention is to provide a power semiconductor module where a plurality of power semiconductor chips are connected in multiple parallel on a substrate, the power semiconductor module configured to reduce an area occupied by the plurality of power semiconductor chips on the substrate and concurrently to reduce wiring inductance in the power semiconductor module, and to provide a power conversion device including the power semiconductor module.

Solution to Problem

In order to achieve the object, the present invention provides a power semiconductor module including: a first insulation substrate; a plurality of semiconductor switching elements arranged on the first insulation substrate; a second insulation substrate arranged opposite the first insulation substrate across the plurality of semiconductor switching elements; a plurality of first conductors with spacer functions and a plurality of second conductors with spacer functions arranged between the plurality of semiconductor switching elements and the second insulation substrate, each of the plurality of first conductors and the plurality of second conductors serving as a spacer between a corresponding one of the plurality of semiconductor switching elements and the second insulation substrate; and an inter-conductor wiring portion formed integrally with each of the plurality of second conductors and configured to electrically connect the plurality of second conductors to each other. In the power semiconductor module, each of the plurality of semiconductor switching elements includes a first electrode, a second electrode arranged opposite the first electrode, and a control electrode arranged opposite the first electrode, the first electrode is electrically connected to a first conductive layer of the first insulation substrate, the second electrode is electrically connected to a second conductive layer of the second insulation substrate through a corresponding one of the plurality of first conductors, the control electrodes are electrically connected to each other through the plurality of second conductors and the inter-conductor wiring portions, and each of the inter-conductor wiring portions is arranged opposite at a predetermined distance from the second conductive layer.

Further, the present invention provides a power conversion device including: a main circuit including one or more pairs of upper and lower arms; and a drive circuit configured to drive the one or more pairs of upper and lower arms. In the power conversion device, each of the one or more pairs of upper and lower arms includes the power semiconductor module described above.

Advantageous Effects of Invention

The present invention provides a power semiconductor module where a plurality of power semiconductor chips are connected in multiple parallel on a substrate, the power semiconductor module configured to reduce an area occupied by the plurality of power semiconductor chips on the substrate and concurrently to reduce wiring inductance in the power semiconductor module, and provides a power conversion device including the power semiconductor module.

With this configuration, it is possible to provide a power semiconductor module and a power conversion device including the power semiconductor module, each of which is reduced in size and is improved in performance and reliability.

Problems, configurations, and effects in addition to those described above will be clarified below in descriptions of embodiments.

DESCRIPTION OF EMBODIMENTS

An embodiment of the present invention will be described below with reference to the drawings. Note that, same or similar constituent elements in each of the drawings are denoted with the same reference signs, and a detailed description thereof will be omitted as appropriate.

First Embodiment

A power semiconductor module according to a first embodiment of the present invention will be described with reference to FIGS. 1A to 5B. In this embodiment, a countermeasure to reduce the size of the power semiconductor module including two insulation substrates, in other words, to reduce an area occupied by power semiconductor chips, will be described; and concurrently, an effect to reduce gate wiring inductance in the power semiconductor module for stabilizing gate control will be described.

Figure 1A:
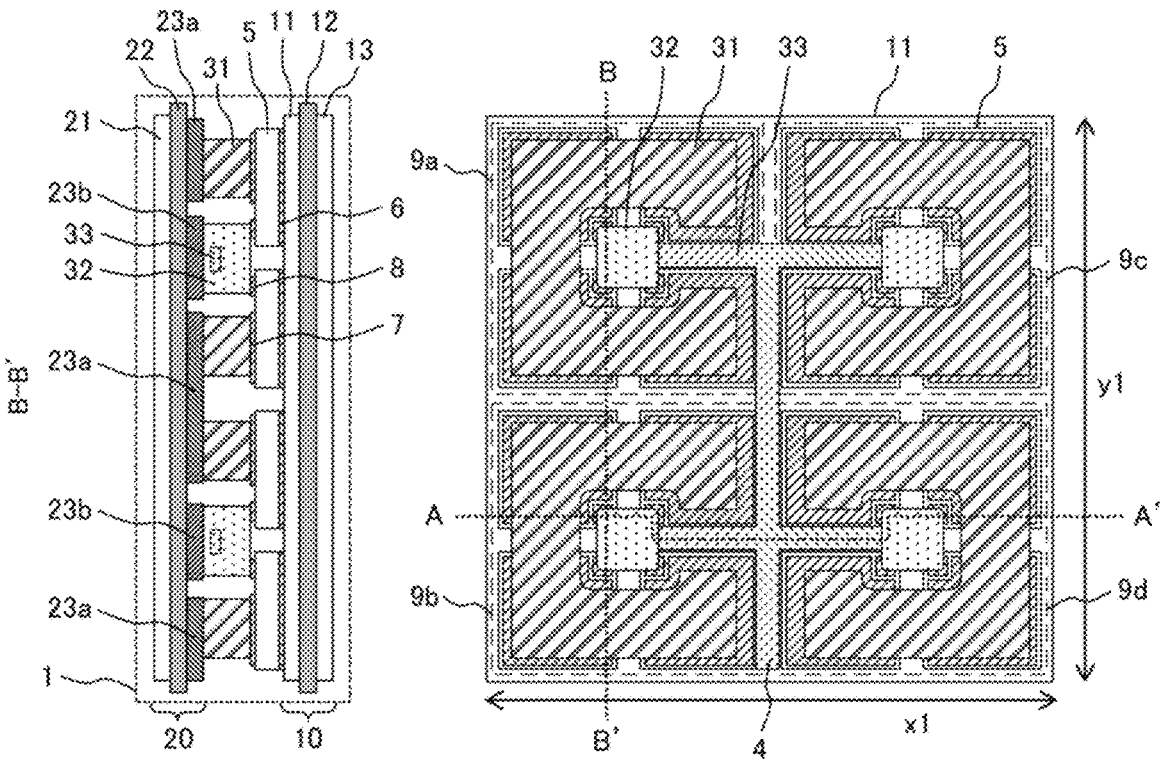
FIG. 1A is a plan view and a sectional view of a power semiconductor module according to a first embodiment of the present invention.
Figure 1A:
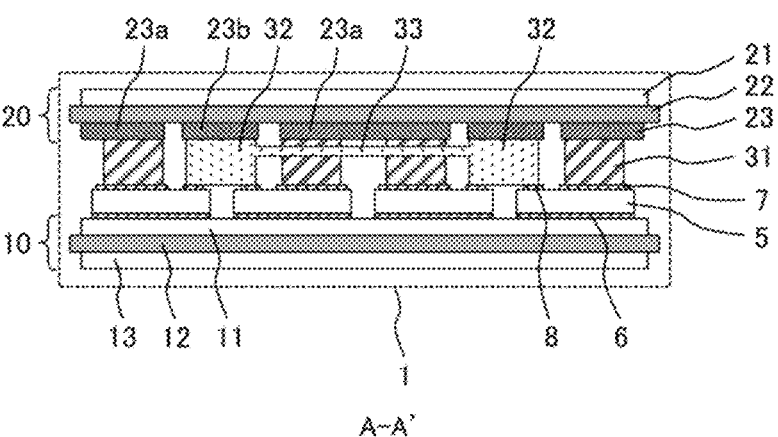

<<Schematic Configuration>>FIG. 1A illustrates a schematic configuration of a power semiconductor module 1 of this embodiment. Note that, in FIG. 1A, for convenience of description, arrangements of originally invisible lower layer components are indicated with dotted lines. FIG. 1A is a plan view of the power semiconductor module 1 as viewed from above, and two sectional views of the power semiconductor module 1, respectively taken along a sectional line A-A' and a sectional line B-B' in the plan view.

<<Sectional Structure>>

The power semiconductor module 1 of this embodiment includes two insulation substrates, i.e., an insulation substrate 10 at a lower position and an insulation substrate 20 at a higher position.

A structure of the power semiconductor module 1 will be described with reference to the sectional view taken along sectional line A-A'. Space not including any component is filled with insulating resin. Description of the space is omitted below unless otherwise required.

In the power semiconductor module 1, the insulation substrate 10 at the lower position includes an insulation layer 12, a conductive layer 11 on an upper surface of the insulation layer 12, and a conductive layer 13 on a lower surface of the insulation layer 12; and the insulation substrate 20 at the upper position includes an insulation layer 22, a conductive layer 21 on an upper surface of the insulation layer 22, and a conductive layer 23 on a lower surface of the insulation layer 22. The insulation substrate 20 is arranged opposite the insulation substrate 10 across a plurality of semiconductor switching elements 5.

Each of the plurality of the semiconductor switching element 5 has, on its one plane, an electrode 6, and on its other plane, an electrode 7 and a control electrode 8; and a current flows longitudinally from the electrode 6 toward the electrode 7. The current is turned on and off by voltage applied to the control electrode 8 based on a potential of the electrode 7. When each of the plurality of semiconductor switching elements 5 is a MOSFET element, the electrode 6 corresponds to a drain electrode, the electrode 7 corresponds to a source electrode, and the control electrode 8 corresponds to a gate electrode.

In order to satisfy a predetermined rated current of the power semiconductor module 1, the plurality of semiconductor switching elements 5 are arranged such that the electrodes 6 are electrically connected to the conductive layer 11 of the insulation substrate 10.

A conductor with spacer function 31 has a conductor shape with a height in a direction perpendicular to a plane of the insulation substrate 10, and electrically connects the electrode 7 of each of the plurality of semiconductor switching elements 5 to the conductive layer 23 as the lower surface of the insulation substrate 20. The conductor with spacer function 31 determines, as a mechanical spacer, a distance between the electrode 7 of each of the semiconductor switching elements 5 and the conductive layer 23 as the lower surface of the insulation substrate 20. The conductor with spacer function 31 is electrically connected to the electrode 7 and the conductive layer 23 with a bonding technique using solder or sintered material. The same applies to a conductor with spacer function 32 as will be described later.

Similarly to the conductor with spacer function 31 (hereinafter, referred to as the "conductor 31"), the conductor with spacer function 32 (hereinafter, referred to as the "conductor 32") has a conductor shape with a height in the direction perpendicular to the plane of the insulation substrate 10, and electrically connects the control electrode 8 of each of the plurality of semiconductor switching elements 5 to the conductive layer 23 as the lower surface of the insulation substrate 20.

The conductive layer 23 to which the conductor 31 is connected has a conductor pattern different from that of the conductive layer 23 to which the conductor 32 is connected; and these conductor patterns are mechanically segregated and electrically insulated from each other. Here, the conductive layer 23 (to which the conductor 31 is connected) has a conductor pattern 23a; and the conductive layer 23 (to which the conductor 32 is connected) has a conductor pattern 23b. The conductor 32 also determines, as a mechanical spacer, a distance between the control electrode 8 of each of the semiconductor switching elements 5 and the conductive layer 23 as the lower surface of the insulation substrate 20.

<<Securing Insulation Distance>>

As illustrated in FIG. 1A, the power semiconductor module 1 includes a plurality of the conductors 32 that are connected to each other through inter-conductor wiring portions 33. Each of the inter-conductor wiring portions 33 is arranged opposite the corresponding conductor pattern 23a; and in a direction perpendicular to a plane of the insulation substrate 20, each of the inter-conductor wiring portions 33 is spaced from the corresponding conductor pattern 23a at a predetermined insulation distance. Each of the inter-conductor wiring portion 33 is concurrently spaced from the electrode 7 of the corresponding semiconductor switching element 5 at a predetermined insulation distance in the direction perpendicular to the plane of the insulation substrate 20.

Further, the conductor 31 and the conductor 32 are spaced from each other at a predetermined insulation distance in a planar direction of the insulation substrate 20. In order to secure the predetermined insulation distances above, each of the inter-conductor wiring portions 33 is positioned, not at an upper limit or lower limit of the height (length in the direction perpendicular to the plane of the insulation substrate 20) of the conductor 32, but at an intermediate part of the height.

The control electrode 8 has a potential switch-controlled based on the potential of the electrode 7, and a maximum potential difference between the control electrode 8 and the electrode 7 is limited to several tens of volt. Thus, an insulation distance between the control electrode 8 and the electrode 7 and an insulation distance between the wirings thereof may be set small. With this configuration, each of the inter-conductor wiring portions 33 is positioned at an upper portion of the height (length in the direction perpendicular to the plane of the insulation substrate 20) of the corresponding conductor 32, the upper portion near the conductor patterns 23a to which the electrodes 7 are connected (i.e., a portion closer to the insulation substrate 20 with respect to the insulation substrate 10).

Accordingly, an absolute value of a magnetic coupling coefficient between the inter-conductor wiring portions 33 and the conductor patterns 23a may be set large. In other words, the magnetic coupling between the wiring connected electrically to the control electrode 8 and the wiring connected electrically to the electrode 7 may be set large.

<<Plan Configuration>>

FIG. 1A is the plan view of the power semiconductor module 1 as viewed from above. For convenience of the description, the insulation substrate 20 is not illustrated. With the insulation substrate 10, the insulation layer 12 and the conductive layer 13 under the insulation layer 12 are not illustrated.

FIG. 1A illustrates an example of an arrangement of the plurality of semiconductor switching elements 5, and a total of 16 semiconductor switching elements 5 are arranged here. In the example, each four of the 16 semiconductor switching elements 5 configure a switching element group 9 (9a, 9b, 9c, or 9d) with the corresponding control electrodes 8 positioned at a center of the switching element group 9 (9a, 9b, 9c, or 9d). A total of four of the switching element groups 9a, 9b, 9c, and 9d are arranged on the conductive layer 11 of the insulation substrate 10.

The conductor 31 has a shape to fit into a range where outer shapes of the electrodes 7 of the four of the semiconductor switching elements 5 are connected. In the example illustrated here, the electrodes 7 of the four of the semiconductor switching elements 5 are connected through one of the conductors 31; alternatively, the one of the conductors 31 may be provided for the electrode 7 of each of the semiconductor switching elements 5.

The conductor 32 has a conductor shape extending over the control electrodes 8 of the four of the semiconductor switching elements 5. The conductor 32 is connected to the conductor pattern 23b as the lower surface of the insulation substrate 20, and functions mechanically as a spacer.

The conductor pattern 23b is mechanically connected to the conductor 32 with solder or a sintered material. When a control voltage has been externally applied to the power semiconductor module 1, the control voltage reaches the conductor 32 through the inter-conductor wiring portion 33 and is transmitted to the control electrode 8 in each of the semiconductor switching elements 5. A control current (a gate current in the case of the MOSFET element) is transmitted on the same path to flow in and out of the control electrode 8 of each of the semiconductor switching elements 5.

As has been described above, when the semiconductor switching element 5 is the MOSFET element, the conductor pattern 23a has the same potential as that of the source electrode (electrode 7), and the conductor pattern 23b has the same potential as that of the gate electrode (control electrode 8); and having the different potentials, these conductor patterns are mechanically separated and electrically insulated from each other.

Figure 1B:
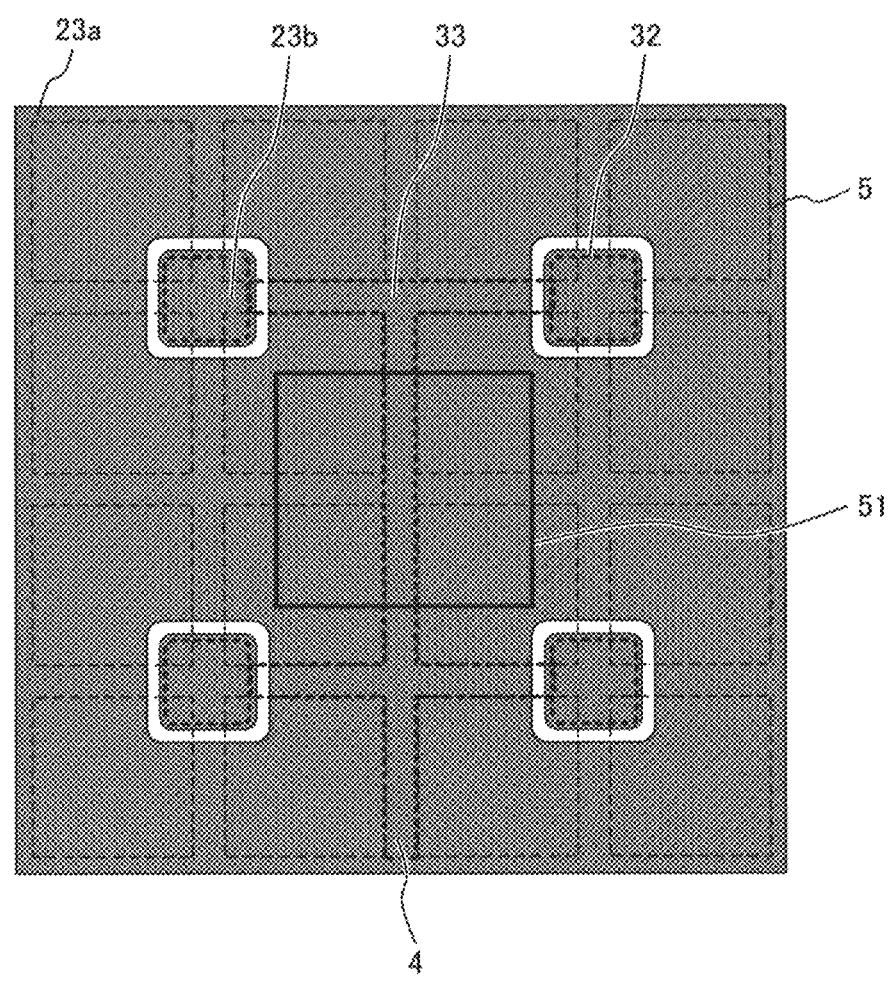
FIG. 1B is a plan view of a main part of FIG. 1A.

FIG. 1B is a layout diagram of the conductor pattern 23 only. In accordance with where the four of the switching element groups 9 (9a, 9b, 9c, and 9d) is arranged, each of the conductor patterns 23b, to which the corresponding conductor 32 is connected, is arranged in an island shape. Each of the conductor patterns 23a is shaped to maintain a gap as the insulation distance from the corresponding conductor pattern 23b. While the conductor patterns 23b are arranged in the island shapes, each of the conductor patterns 23a has a large width without being split. In correspondence to each of the conductor patterns 23a and 23b, the conductor 32 and the inter-conductor wiring portion 33 have shapes indicated with broken lines. Note that, in FIG. 1B, a routing structure of a control wiring (gate wiring) according to the present invention is denoted with a reference sign 51, and a sectional structure thereof will be described later with reference to FIG. 5A.

As has been described above, with the power semiconductor module 1 of this embodiment, the electrode 6 (drain electrode: a first electrode) of each of the semiconductor switching elements 5 is connected to a conductor pattern of the conductive layer 11 of the insulation substrate 10 with the bonding means, e.g., solder, metal bonding, or sintering; the electrode 7 (source electrode: a second electrode) of each of the semiconductor switching elements 5 is connected to the corresponding conductor pattern 23a as the conductive layer 23 of the insulation substrate 20 with similar bonding means; and the control terminal 8 (gate electrode) is connected to the corresponding inter-conductor wiring portion 33 with the similar bonding means. The control terminal 8 (gate electrode) is connected to, for example, a conductor pattern near edges of the insulation substrates 10 and 20, such as a gate lead-out portion 4.

<Effect>

This embodiment provides two effects as will be described below.

Each of the conductors 32 is introduced to provide a wiring path for the corresponding control electrode 8; and each of the inter-conductor wiring portion 33 is arranged at the intermediate position between the insulation substrate 10 at the lower position and the insulation substrate 20 at the higher position, so that the corresponding inter-conductor wiring portion 33 is reliably positioned at the required insulation distance from the surrounding conductive elements (i.e., the conductor pattern 23a, the electrode 7 of the semiconductor switching element 5, and the conductive layer 11) in the direction perpendicular to the planar direction of the insulation substrates 10 and 20.

With this configuration, the insulation distance in the planar direction of the insulation substrates 10 and 20 (a distance between each of the semiconductor switching elements 5) is kept to a minimum (the semiconductor switching elements 5 are spaced at a minimum distance from each other). Consequently, the areas occupied by a predetermined number of the semiconductor switching elements 5 on the insulation substrates 10 and 20 are designed to be smaller. In this state, the power semiconductor module (the area thereof) is designed smaller.

For comparison, each of FIGS. 2A, 2B, 3A, and 3B illustrates an example of an arrangement of a semiconductor switching element 5 in a conventional power semiconductor module. The semiconductor switching element 5 has the same size and the same structure of electrodes as those in FIGS. 1A and 1B.

Figure 2A:
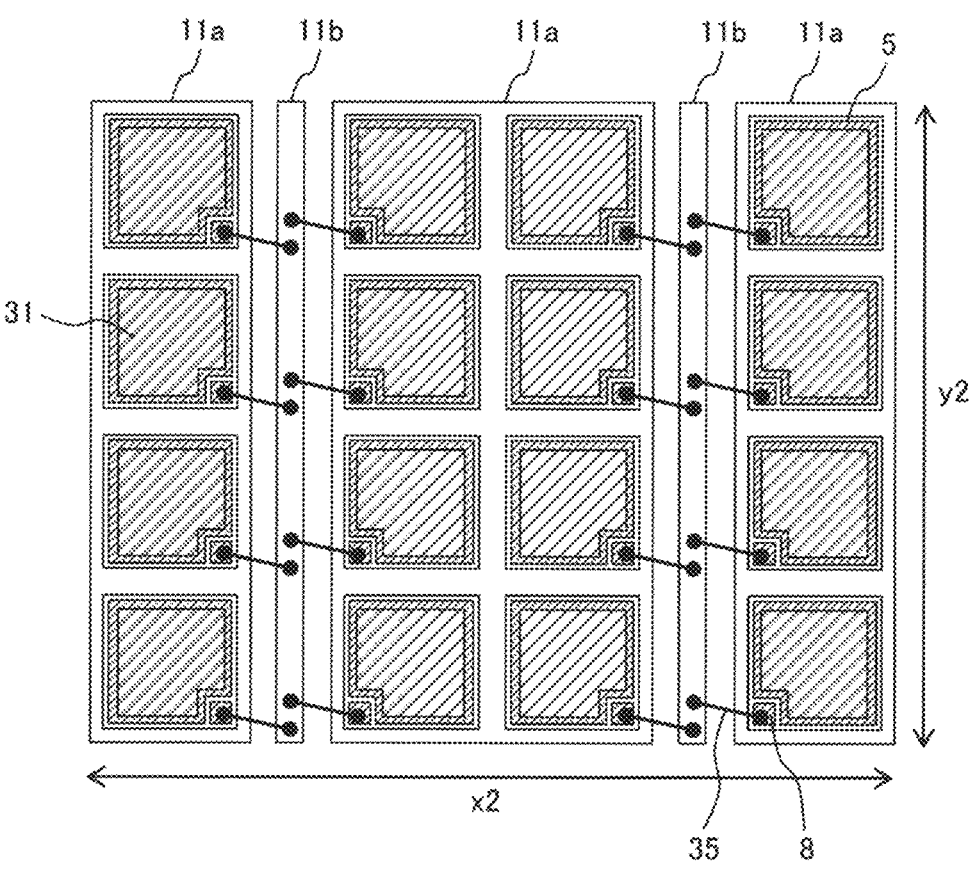
FIG. 2A is a plan view of a conventional power semiconductor module.
Figure 2B:
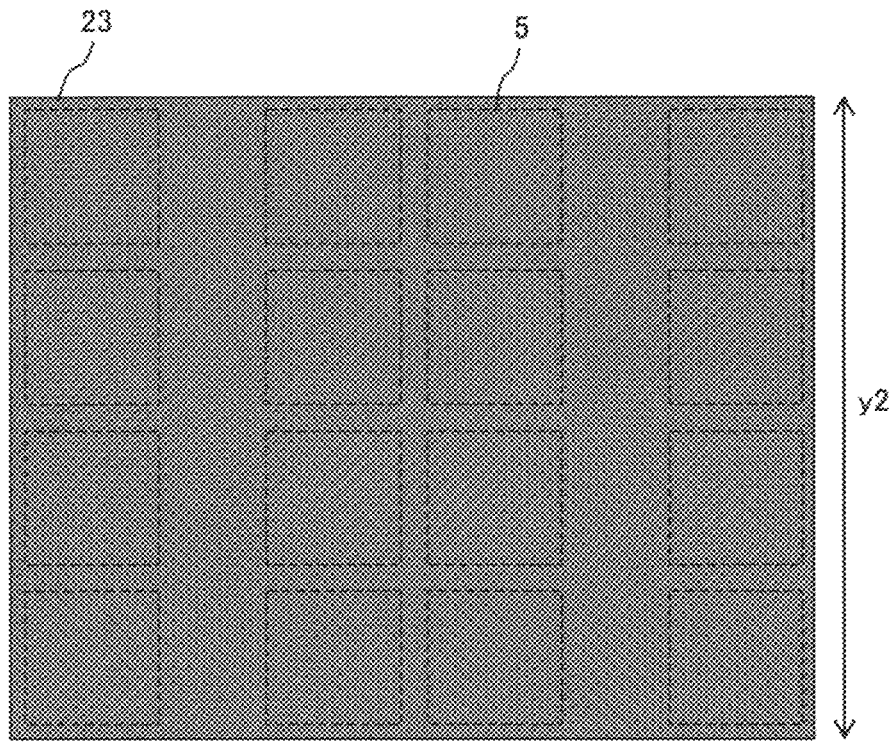
FIG. 2B is a plan view of a main part of FIG. 2A.
Figure 2B:
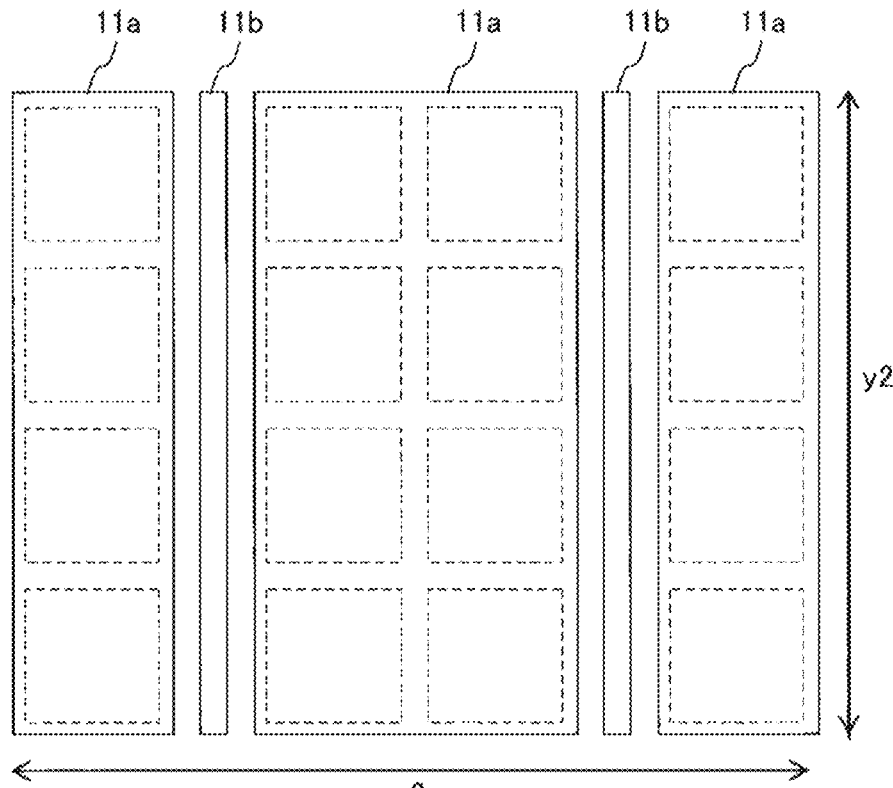

Each of FIGS. 2A and 2B is a diagram of wirings connected to a control electrode 8 on an insulation substrate, the diagram illustrated with reference to PTL 1. FIG. 2B is a layout diagram of a conductive layer 23, a conductor pattern 11a, and a conductor pattern 11b only.

FIG. 2A is a layout diagram where 16 of the semiconductor switching elements 5 are arranged in parallel. Each of the semiconductor switching elements 5 has the control electrode (a gate electrode) 8 connected through a bonding wire 35 to the corresponding conductor pattern 11b of an insulation substrate 10. Each of the semiconductor switching elements 5 has an electrode 6 (drain electrode: a first electrode) connected to the corresponding conductor pattern 11a of the insulation substrate 10, and has an electrode 7 (source electrode: a second electrode) connected to the conductive layer 23 of an insulation substrate 20.

The conductor pattern 11a has a different potential from that of the conductor pattern 11b, and needs to be planarly spaced at an insulation distance from the conductor pattern 11b. Thus, areas for the conductor patterns 11a and 11b, in addition to an area as the space between the conductor patterns 11a and 11b, are required of a conductor pattern 11. As clearly illustrated in FIGS. 2A and 2B, the areas required of the conductor pattern 11 are greater than in FIG. 1 of this embodiment.

For example, when each of the semiconductor switching elements 5 is the MOSFET element, the electrode 6 corresponds to the drain electrode, the electrode 7 corresponds to the source electrode, and the control electrode 8 corresponds to the gate electrode. In other words, a high potential of the drain electrode is applied to the conductor pattern 11*a,* and a relatively low potential of the gate electrode is applied to the conductor pattern 11*b;* and in this state, the conductor patterns 11*a* and 11*b* need to be spaced at a predetermined distance from each other, so as to be reliably insulated from each other. When areas surrounding the conductor patterns 11*a* and 11*b* are filled with an insulator, with a potential difference up to 1.2 kV, for example, the conductor patterns 11*a* and 11*b* need to be spaced at a distance of 1.0 mm or more from each other.

Figure 3A:
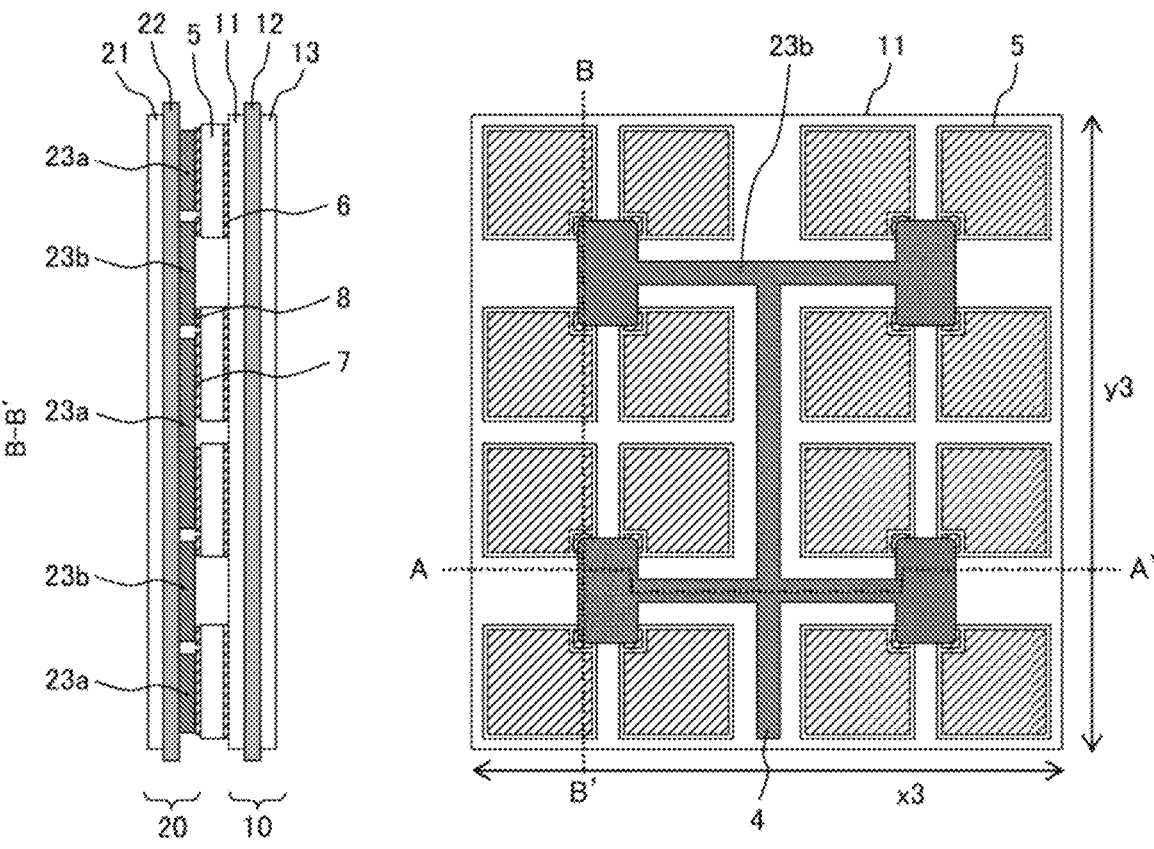
FIG. 3A is a plan view and a sectional view of another conventional power semiconductor module.
Figure 3A:
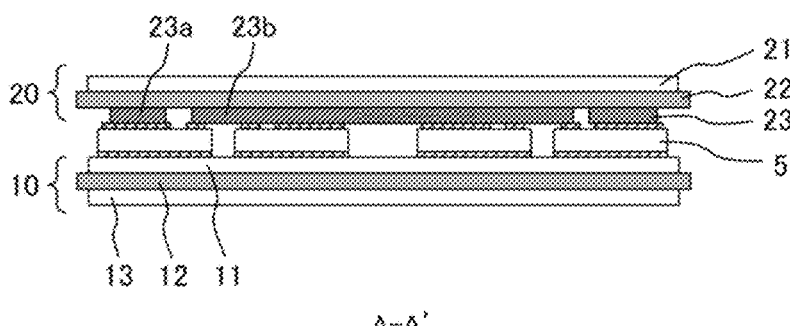
Figure 3B:
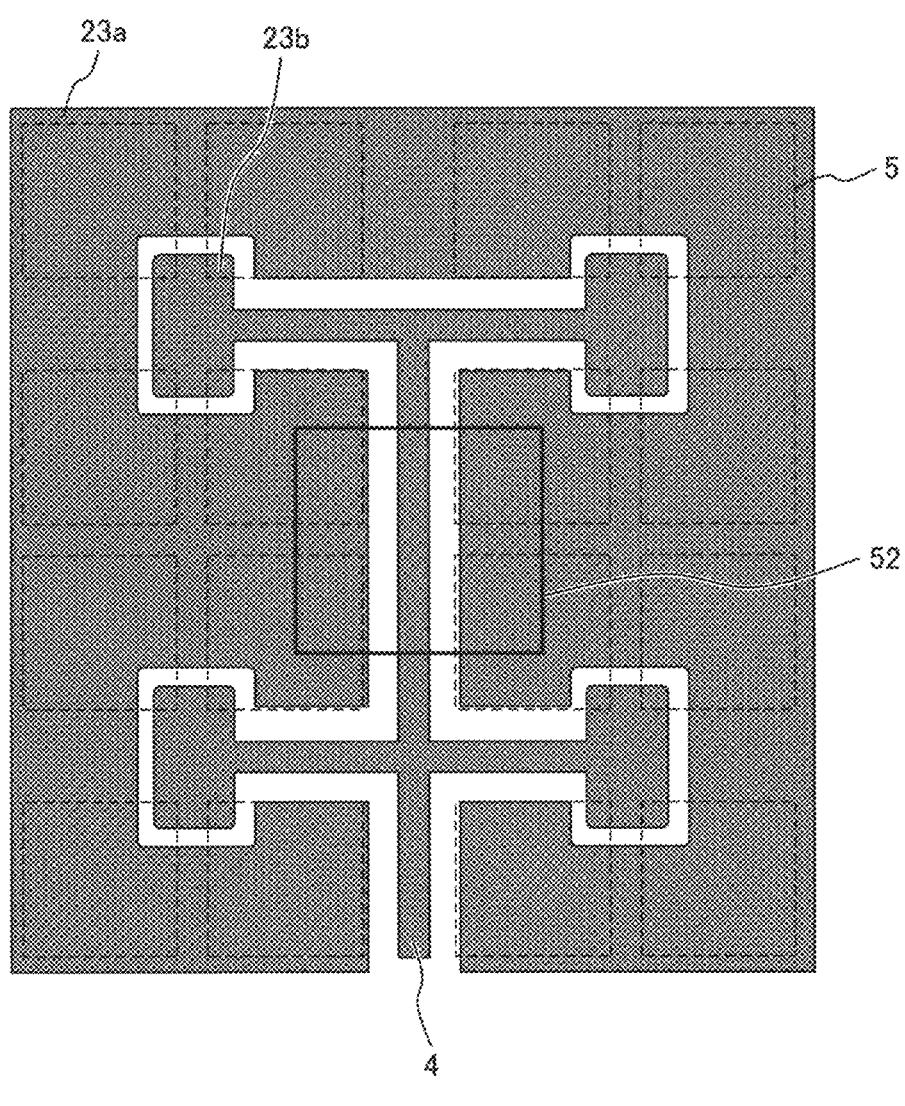
FIG. 3B is a plan view of a main part of FIG. 3A.

FIG. 3A illustrates, with a power semiconductor module including two insulation substrates 10 and 20, an example of a wiring structure. Here, 16 of semiconductor switching elements 5 are arranged using a conductive layer of each of the insulation substrates, instead of using the conductors with spacer functions illustrated in FIGS. 1A and 1B. The wiring structure is illustrated with reference to PTL 2. In FIGS. 3A and 3B, same components as those in FIGS. 1A and 1B are denoted with the same reference signs.

In FIG. 3A, each of the semiconductor switching elements 5 has an electrode 7 (a source electrode: a second electrode) and a control electrode (gate electrode) 8 connected to a conductive layer 23 of the insulation substrate 20. The conductive layer 23 is divided into a conductor pattern 23*a* for the electrode 7 (source electrode: second electrode), and a conductor pattern 23*b* for the control electrode (gate electrode) 8. In order to route the wiring connected electrically to the control electrode (gate electrode) 8, as illustrated in FIG. 3A, the control electrode (gate electrode) 8 and the electrode 7 (source electrode: second electrode) of each of the semiconductor switching elements 5 need to be spaced at an insulation distance from each other in a planar direction. The reason therefor is as follows: a lower surface of each of the conductor pattern 23*b* is at the same height as an upper surface of the electrode 7 (source electrode: second electrode) of the corresponding semiconductor switching element 5; and thus when each of the conductor patterns 23*a* and the corresponding conductor pattern 23*b* have a small distance therebetween, the electrode 7 and the control electrode 8 may come into contact with each other or have an insufficient insulation distance therebetween.

Due to restricted space for securing the insulation distance in a perpendicular direction of the insulation substrates, the power semiconductor module secures the insulation distance in the planar direction of the insulation substrates. With this configuration, some of 16 of the semiconductor switching elements 5 need to be arranged at a greater distance from the others. As illustrated in FIG. 3A, the area required of the insulation substrates is greater than in FIG. 1 of this embodiment.

FIG. 3B illustrates a shape of each of the conductor patterns as the conductive layer 23. With the conductor pattern 23*a* for the electrode 7 (source electrode: second electrode) of each of the semiconductor switching elements 5 and the conductor pattern 23*b* for the control electrode (gate electrode) 8 of each of the semiconductor switching elements 5, the conductor pattern 23*a* is largely split by the conductor pattern 23*b*.

This configuration increases a self-inductance of the conductor pattern 23*a*. The electrode 7 (source electrode: second electrode) of each of the plurality of semiconductor switching elements 5 is electrically connected through the conductor pattern 23*a,* thereby causing a deviation in operational timing between the plurality of semiconductor switching elements 5. For example, when switching is performed, switching current of each of the plurality of semiconductor switching elements 5 is unbalanced.

Figures 4, 5A:
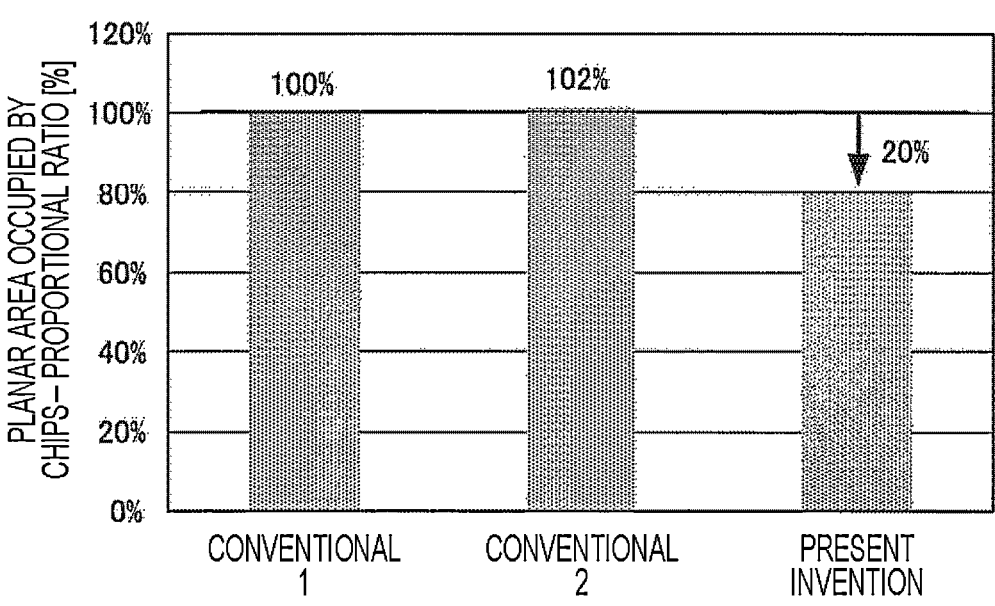
FIG. 4 shows an example of an effect of the present invention.
FIG. 5A conceptually illustrates a function and an effect of the power semiconductor module according to the first embodiment of the present invention.

FIG. 4 shows one of the effects of the power semiconductor module of this embodiment illustrated in FIGS. 1A and 1B. In FIG. 4, 16 of the semiconductor switching elements 5 of this embodiment are arranged under the same conditions as those of the conventional power semiconductor modules, and the size of the area occupied by the semiconductor switching elements 5 (chips) is shown in a proportional ratio to those of the conventional power semiconductor modules.

The semiconductor switching elements 5 are arranged under the conditions below: each of the semiconductor switching elements 5 has a chip size of 5 mm square; the chips are arranged at a distance of 1 mm from each other; the control routing wiring has a width of 1 mm; the control routing wiring has an insulation distance of 1 mm; and the conductor patterns are connected to and overlap the semiconductor switching elements 5 by 0.5 mm.

The "present invention" represents the arrangement of this embodiment (FIGS. 1A and 1B), "conventional 1" represents the arrangement in FIGS. 2A and 2B, and "conventional 2" represents the arrangement in FIGS. 3A and 3B. Based on the conventional 1 as 100%, the proportional ratio of the planar area occupied by the chips of the present invention is 80%. Compared with the conventional 2 showing 102% and thus not much difference from the conventional 1, the arrangement of the present invention reduces the area by 20%.

The above is an example of quantitative comparison. As clearly shown in this embodiment according to the present invention, the insulation distance required of the inter-conductor wiring portion 33 from the surrounding conductive elements is secured in the perpendicular direction of the insulation substrates. Accordingly, the planar areas of the insulation substrates including the semiconductor switching elements 5 and the wirings thereof are effectively reduced.

Figure 5B:
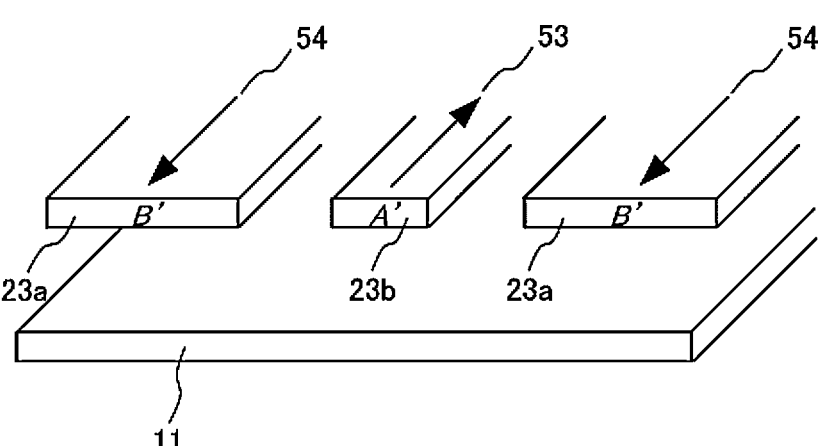
FIG. 5B conceptually illustrates a function of the another conventional power semiconductor module.

Each of FIGS. 5A and 5B illustrates another effect of this embodiment. FIG. 5A is a perspective view of the inter-conductor wiring portion 33, together with the conductor pattern 23*a* and the conductive layer 11 arranged around the inter-conductor wiring portion 33. FIG. 5A illustrates a main part of a cross-sectional structure of the region 51 in FIG. 1B. The inter-conductor wiring portion 33 is connected to the control electrode (gate electrode) 8 of each of the semiconductor switching elements 5 through the corresponding conductor 32. When each of the semiconductor switching elements 5 is the MOSFET element, the inter-conductor wiring portion 33 corresponds to a gate wiring portion.

Each of the conductor pattern 23*a* is a wiring connected electrically to the corresponding electrode 7 (second electrode), i.e., the source electrode of each of the semiconductor switching elements 5, through the corresponding conductor 31; and this configuration clearly shows a relationship between a main wiring (A) of a gate drive current and a return current wiring (B).

The gate wiring and the source wiring have a potential difference of several tens of volts at maximum, and thus have a smaller insulation distance therebetween. When the areas surrounding these wirings are sealed with the insulator, the insulation distance therebetween is reduced to approximately 0.3 mm. The inter-conductor wiring portion 33 is positioned at any part of the height of the conductor 32. Accordingly, the inter-conductor wiring portion 33 is positioned at a minimum distance from the conductor pattern 23*a,* the minimum distance where the inter-conductor wiring portion 33 is reliably insulated from the conductor pattern 23a, and the magnetic coupling therebetween is thus significantly increased.

A value of mutual inductance is calculated multiplying a value of the self-inductance by a coupling coefficient K. Here, the coupling coefficient is calculated as KA–B=–0.83. An absolute value of the mutual inductance is calculated on the conditions that the inter-conductor wiring portion 33 is spaced at 0.8 mm from the conductor pattern 23a, the inter-conductor wiring portion 33 has a width of 1 mm, and the inter-conductor wiring portion 33 has a thickness of 0.4 mm.

FIG. 5B is a perspective view of the conventional power semiconductor module arranged in FIGS. 3A and 3B, with a focus on a wiring portion 23b (wiring A') connected to the control electrode (gate electrode) 8 and a wiring portion 23a (wiring B') connected to the electrode 7 (source electrode: second electrode) in FIG. 3B. FIG. 5B illustrates a main part of a cross-sectional structure of the region 52 in FIG. 3B. With the conventional power semiconductor module, at each side of the conductor pattern 23b as the gate wiring portion, the conductor pattern 23a as a source wiring portion is arranged at the insulation space from the conductor pattern 23b in the planar direction.

Here, an absolute value of coupling coefficient is calculated on the conditions that the conductor pattern 23b is spaced at 1 mm from the conductor patterns 23a adjoining thereto, the conductor pattern 23b has a width of 1 mm, and the conductor pattern 23b has a thickness of 0.3 mm. When calculated on the conditions above, the coupling coefficient results in KA'–B'=–0.68. As seen here, with the structure of this embodiment (FIG. 5A), the absolute value of the coupling coefficient is greater and negative. Accordingly, with the greater mutual inductance generated, it is possible to set loop inductance of the gate wiring path smaller.

As has been described above, the power semiconductor module according to this embodiment includes: the first insulation substrate 10; the plurality of semiconductor switching elements 5 arranged on the first insulation substrate 10; the second insulation substrate 20 arranged opposite the first insulation substrate 10 across the plurality of semiconductor switching elements 5; the plurality of first conductors 31 with spacer functions and the plurality of second conductors 32 with spacer functions arranged between the plurality of semiconductor switching elements 5 and the second insulation substrate 20, each of the plurality of first conductors 31 and the plurality of second conductors 32 serving as a spacer between a corresponding one of the plurality of semiconductor switching elements 5 and the second insulation substrate 20; and an inter-conductor wiring portion 33 formed integrally with each of the plurality of second conductors 32 and configured to electrically connect the plurality of second conductors 32 to each other. In the power semiconductor module, each of the plurality of semiconductor switching elements 5 includes the first electrode 6, the second electrode 7 arranged opposite the first electrode 6, and the control electrode 8 arranged opposite the first electrode 6, the first electrode 6 is electrically connected to the first conductive layer 11 of the first insulation substrate 10, the second electrode 7 is electrically connected to the second conductive layer 23a of the second insulation substrate 20 through a corresponding one of the plurality of first conductors 31, the control electrodes 8 are electrically connected to each other through the plurality of second conductors 32 and the inter-conductor wiring portions 33, and each of the inter-conductor wiring portions 33 is arranged opposite at a predetermined distance from the second conductive layer 23a.

The control electrodes 8 are electrically connected to each other through the second conductors 32 and the inter-conductor wiring portions 33, and each of the control electrodes 8 is electrically connected to a third conductive layer 23b of the second insulation substrate 20 through a corresponding one of the second conductors 32.

The predetermined distance corresponds to an insulation distance where the inter-conductor wiring portion 33 is electrically insulated from the second conductive layer 23a.

The inter-conductor wiring portion 33 forms the mutual inductance between the inter-conductor wiring portion 33 and the second conductive layer 23a, the mutual inductance determined based on the negative coupling coefficient between the inter-conductor wiring portion 33 and the second conductive layer 23a.

The inter-conductor wiring portion 33 and the second conductive layer 23a are arranged such that the coupling coefficient between the inter-conductor wiring portion 33 and the second conductive layer 23a is equal to or greater than –1.0 or equal to or smaller than –0.8.

With these configurations, the power semiconductor module of this embodiment provides the two effects below:

(1) the mounting efficiency of the semiconductor switching elements is improved;

(2) the control wiring (gate wiring) inductance in the power semiconductor module is reduced.

Accordingly, a power semiconductor module that is reduced in size and is excellent in stabilizing the gate control is provided.

Note that, when each of the semiconductor switching elements 5 is an SiC-MOSFET element, as has been described above, the chip area is small and thus, the semiconductor switching elements 5 need to be connected in multiple parallel such that the rated current of the power semiconductor module is secured. In view of this, this embodiment introduces the particularly effective routing structure of the control wiring (gate wiring), by which the desired rated current of the power semiconductor module is secured and concurrently the power semiconductor module is reduced in size.

Second Embodiment

A power semiconductor module according to a second embodiment of the present invention will be described with reference to FIGS. 6A and 6B.

<<Schematic Configuration>>

Figure 6A:
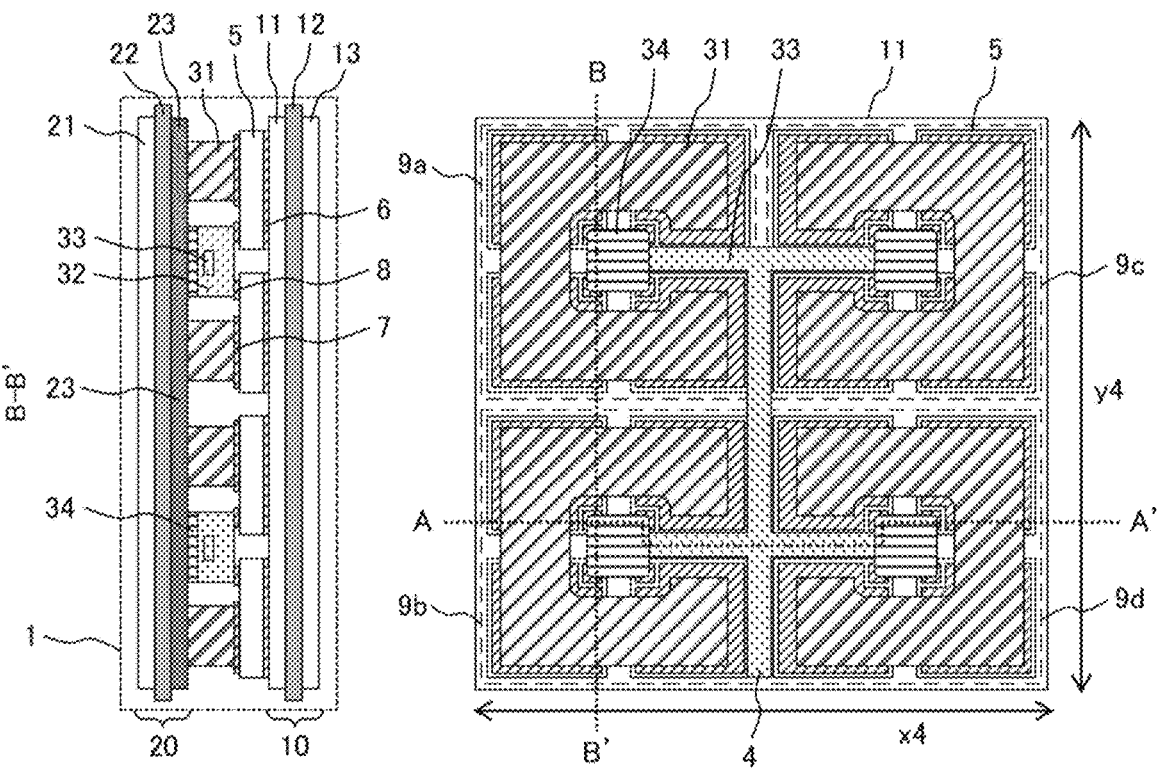
FIG. 6A is a plan view and a sectional view of a power semiconductor module according to a second embodiment of the present invention.
Figure 6A:
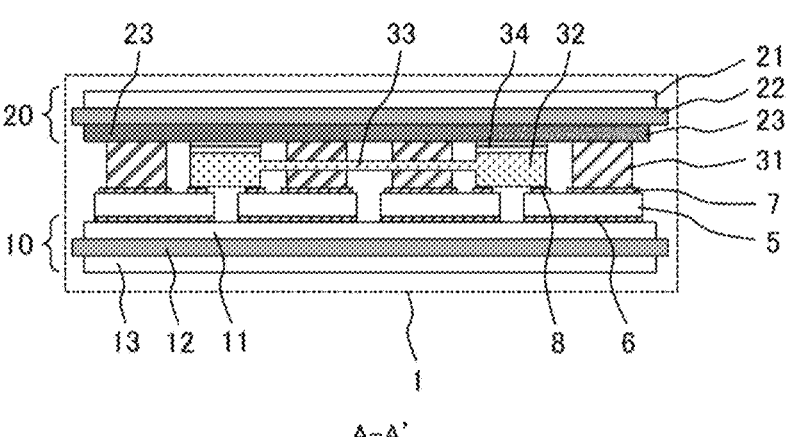
Figure 6B:
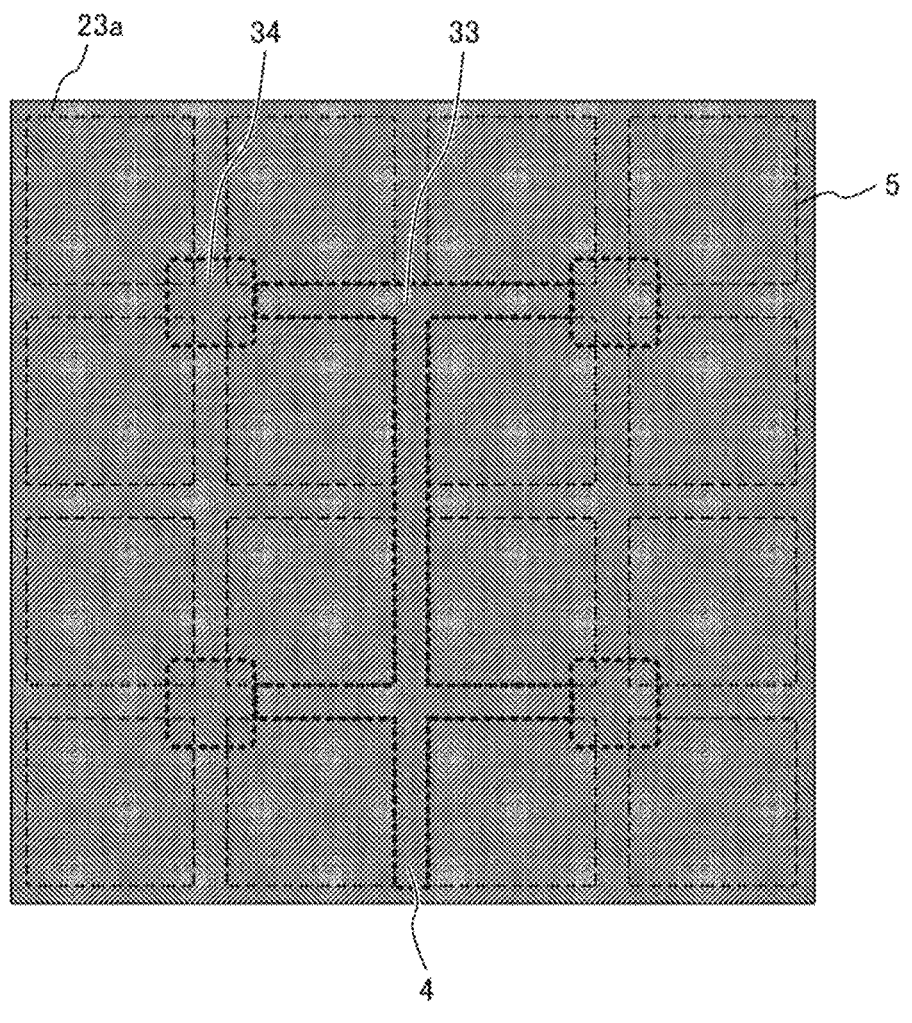
FIG. 6B is a plan view of a main part of FIG. 6A.

FIG. 6A shows a schematic configuration of a power semiconductor module 1 of this embodiment. FIG. 6A is a plan view of the power semiconductor module 1 as viewed from above, and two sectional views of the power semiconductor module 1, respectively taken along a sectional line A-A' and a sectional line B-B' in the plan view. For convenience of description, an insulation substrate 20 is not illustrated; and with an insulation substrate 10, an insulation layer 12 and a conductive layer 13 under the insulation layer 12 are not illustrated in the plan view.

<<Sectional Structure>>

Similarly to the first embodiment, the power semiconductor module 1 of this embodiment includes two insulation substrates, i.e., the insulation substrate 10 at a lower position and the insulation substrate 20 at a higher position. The power semiconductor module 1 of this embodiment has differences from that of the first embodiment, in a structure of a conductor 32 with spacer function and a shape of a conductor pattern of a conductive layer 23 of the insulation substrate 20. With a focus on the differences, the power semiconductor module 1 of this embodiment will be described with mainly reference to the sectional view taken along the sectional line A-A'.

In this embodiment, each of a plurality of semiconductor switching elements 5 has a control electrode 8; and a plurality of the control electrodes 8 are connected to each other through a plurality of the conductors 32 with spacer functions (hereinafter, referred to the "conductor 32"), and an inter-conductor wiring portion 33 in each of the plurality of conductors 32 is configured to route wiring of the corresponding control electrode 8. Unlike in the first embodiment, each of the conductors 32 is smaller in height; and each of the conductors 32 and the conductive layer 23 as a lower portion of the insulation substrate 20 have an insulator 34 interposed therebetween.

Here, the conductor 32 and the insulator 34 are integrally formed and configured to mechanically function as a spacer. With the insulator 34 introduced, only a potential of an electrode 7 (a source electrode: a second electrode) of each of the semiconductor switching elements 5 is applied to the conductive layer 23. Thus, unlike the conductive layer 23 of FIG. 1B, the conductive layer 23 of this embodiment is not divided into the conductor patterns 23a and 23b. As illustrated in FIG. 6B, the conductive layer 23 has a conductor pattern as an undivided, flat surface. With this configuration, compared with the first embodiment, this embodiment provides effects as will be described below.

As a first effect, when each of the plurality of semiconductor switching elements 5 is powered on (power-on current flows therethrough), in a path where the power-on current flows from the corresponding electrode 7 (source electrode: second electrode) of each of the plurality of semiconductor switching elements 5 to the conductive layer 23 through the conductor 31, the resistance and the inductance is reduced. The reason therefor is that the conductive pattern of the conductive layer 23a has an increased area, as illustrated in FIG. 6B.

As a second effect, the power semiconductor module of this embodiment is more easily assembled. With the conductive layer 23 of the first embodiment, it is essential to position each of the conductors 32 with the corresponding conductor pattern 23b. Additionally, the solder or the sintered material may squeeze out unexpectedly, causing an insulation fault. In this embodiment, the conductors 32 and the conductive layer 23 do not need to be positioned, thereby resulting in less assembly failures and improved yield rate in manufacturing power semiconductor modules.

Note that, the power semiconductor module of this embodiment provides the effects above, together with the effects described in the first embodiment.

Further, in addition to the effects of the first embodiment, the power semiconductor module of this embodiment is effective in reducing the resistance and the inductance of the current path (conductive layer 23a).

Accordingly, the power semiconductor module is not only reduced in size and excellent in stabilizing the gate control but also is configured to reduce the inductance of the large current path and provide higher yield rate in the manufacturing.

Third Embodiment

A power semiconductor module according to a third embodiment of the present invention will be described with reference to FIGS. 7A and 7B.

14

<<Schematic Configuration>>

Figure 7A:
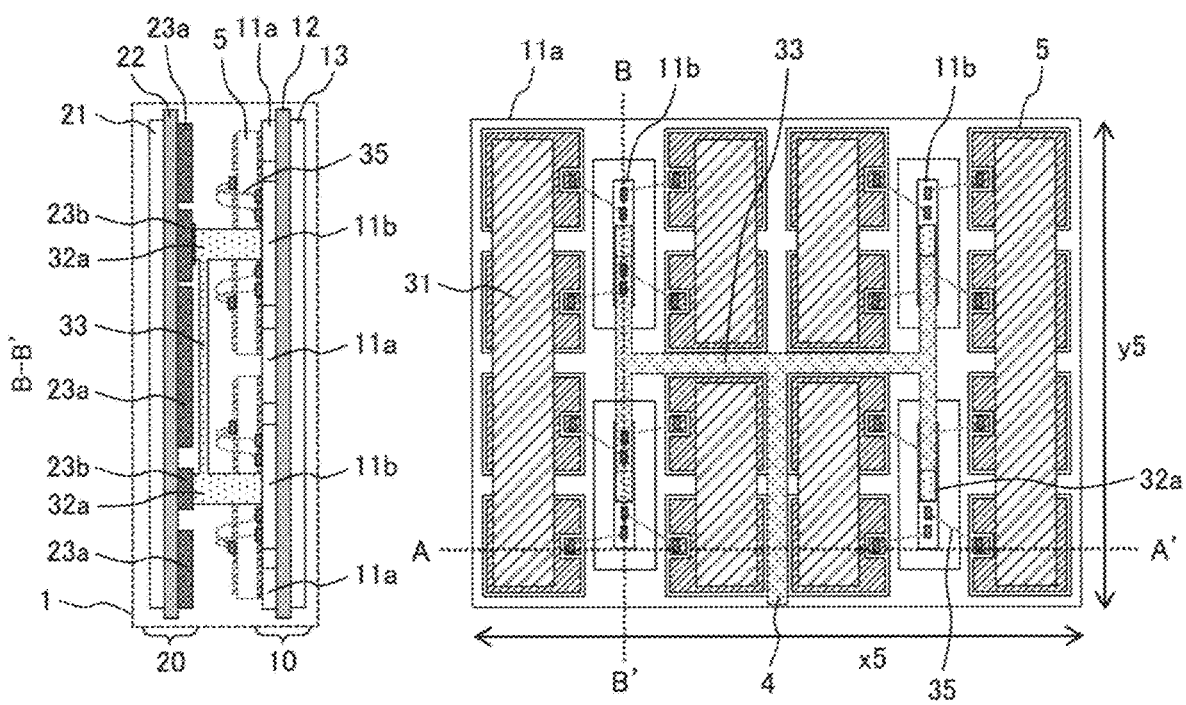
FIG. 7A is a plan view and a sectional view of a power semiconductor module according to a third embodiment of the present invention.
Figure 7A:
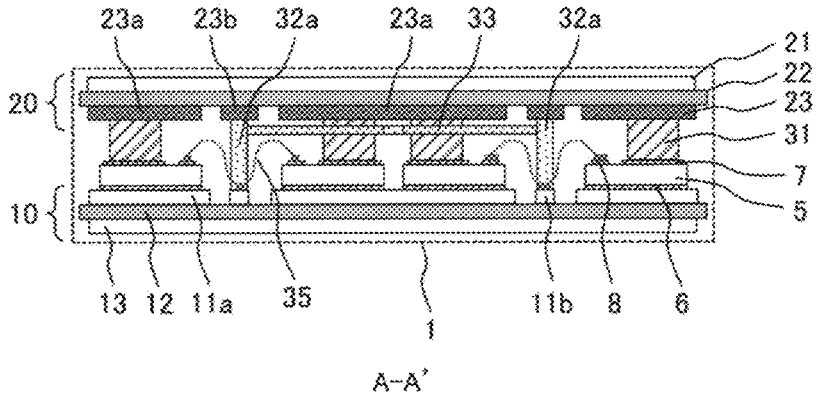

FIG. 7A illustrates a schematic configuration of a power semiconductor module 1 of this embodiment. FIG. 7A is a plan view of the power semiconductor module 1 as viewed from above, and two sectional views of the power semiconductor module 1, respectively taken along a sectional line A-A' and a sectional line B-B' in the plan view. For convenience of description, an insulation substrate 20 is not illustrated; and with an insulation substrate 10, an insulation layer 12 and a conductive layer 13 under the insulation layer 12 are not illustrated in the plan view.

<<Sectional Structure>>

Similarly to the first embodiment, the power semiconductor module 1 of this embodiment includes two insulation substrates, i.e., the insulation substrate 10 at a lower position and the insulation substrate 20 at a higher position. The power semiconductor module 1 of this embodiment has differences from the first and the second embodiments, in a structure of a conductor 32 (32a) with spacer function, a shape of a conductor pattern (11a and 11b) as a conductive layer 11 of the insulation substrate 10, and a configuration where control electrodes 8 of semiconductor switching elements 5 are electrically connected through a plurality of bonding wires 35. With a focus on the differences, the power semiconductor module 1 of this embodiment will be described with mainly reference to the sectional view taken along the sectional line A-A'.

In this embodiment, the control electrode 8 of each of a plurality of the semiconductor switching elements 5 is electrically connected through the corresponding bonding wire 35 to the corresponding conductor pattern 11b as an upper conductive element of the insulation substrate 10. As illustrated in the plan view, each of the conductor patterns 11b has a shape of plurality of islands, and is surrounded by the conductor patterns 11a. Each of the conductors 32a with spacer functions (hereinafter, referred to as the "conductor 32a") is mechanically and electrically connected between the corresponding conductor pattern 11b and the corresponding conductor pattern 23b of the insulation substrate 20.

Each of the conductors 32a is electrically connected to the corresponding inter-conductor wiring portion 33; and each of the inter-conductor wiring portions 33 is spaced at a predetermined insulation distance from the corresponding conductor pattern 23a in a direction perpendicular to a plane of the insulation substrate 20.

Here, the inter-conductor wiring portions 33 and the conductor patterns 23a have similar wiring structures to those in the first embodiment, so that the control wiring inductance in the power semiconductor module is reduced. Further, in this embodiment, the control electrodes 8 of the semiconductor switching elements 5 are connected to each other through the bonding wire 35 and thus, regardless of where the control electrodes 8 are positioned in the semiconductor switching elements 5, the effect of the present invention described above is still provided.

As illustrated in FIG. 7A, each of the bonding wires 35 easily creates a three-dimensional wiring structure. With this configuration, even when the control electrode 8 of each of the semiconductor switching elements 5 is arranged at a center of a side of the corresponding semiconductor switching element 5, the control electrode 8 is still electrically connected.

As another effect of this embodiment, each of the semiconductor switching elements 5 is designed to be arranged at an equal electric distance from the gate lead-out portion 4 in the power semiconductor module 1.

Figure 7B:
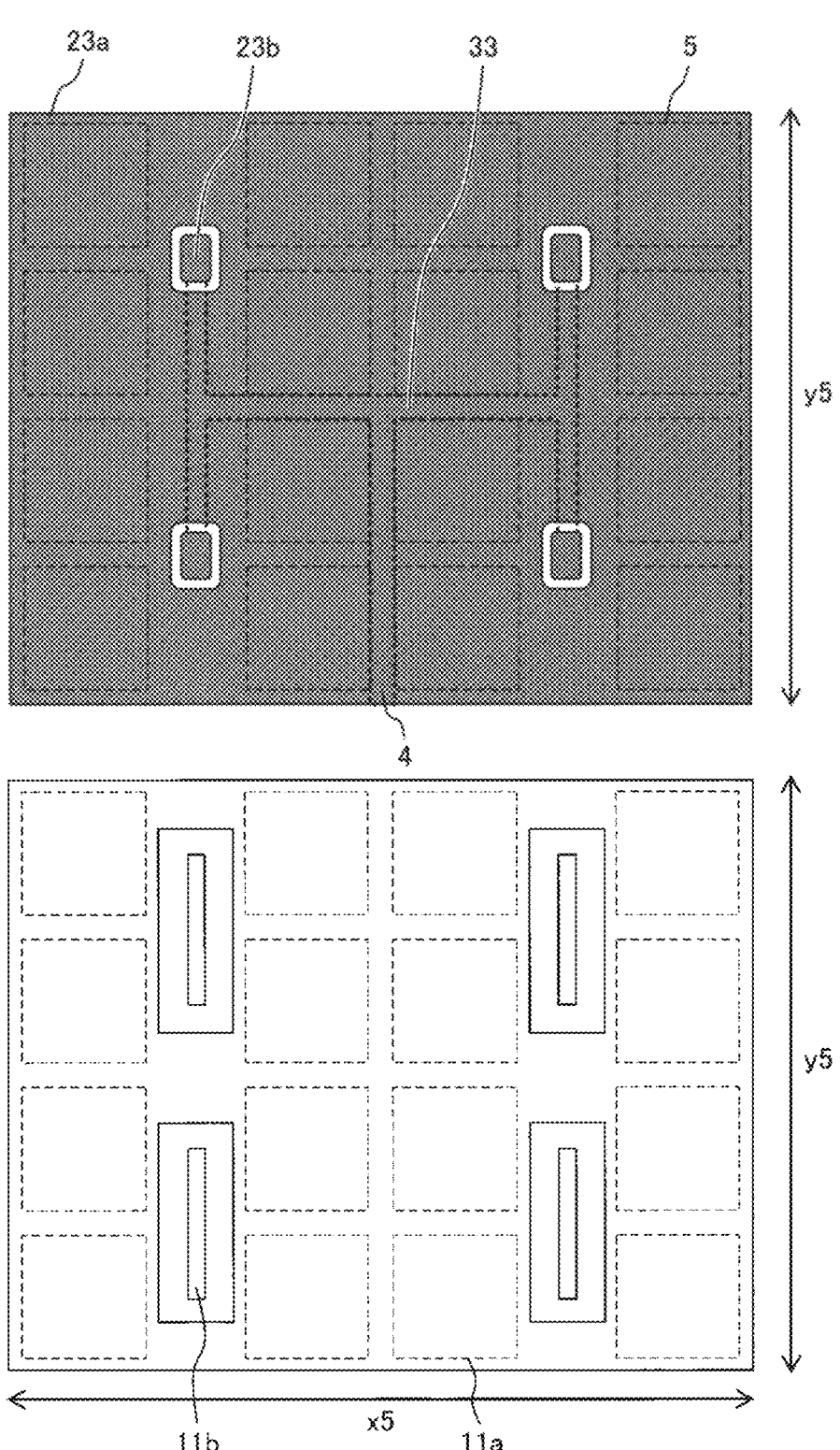
FIG. 7B is a plan view of a main part of FIG. 7A.

In FIG. 7B, an upper diagram illustrates wiring arrangements of the conductor pattern 23a, the conductor pattern 23b, and the inter-conductor wiring portion 33 (indicated with dotted lines). For each four of the semiconductor switching elements 5, the corresponding conductor pattern 23b is arranged in the island shape, from which the inter-conductor wiring 33 extends in an H-shape. With this configuration, each of the wirings of the control electrodes 8 effectively has an equal electric length (resistance and inductance).

In FIG. 7B, a lower diagram illustrates wiring arrangements of the conductor patterns 11 (11a and 11b) only, the conductor pattern 11 (11a and 11b) as the upper conductive element of the insulation substrate 10. The conductor patterns 11b for connecting the control electrodes 8 of the semiconductor switching elements 5 are arranged in the four islands. With this configuration, each of the conductor patterns 11a is not spaced at as a large distance as the conductor patterns 11a in the lower diagram of FIG. 2B from the corresponding conductor pattern 11b. Here, the inductance generated between each of the conductor patterns 11a and the corresponding semiconductor switching element 5 is effectively reduced.

As has been described above, with the power semiconductor module of this embodiment, while not reduced in size of the power semiconductor module as in the first embodiment, the control electrodes 8 are electrically connected through the bonding wires 35, and the conductors 32a and the inter-conductor wiring portions 33 are concurrently used in the wiring path of the control electrodes 8. With these configurations, the power semiconductor module of this embodiment provides the two effects below:

(1) regardless of where the control electrodes 8 are arranged in the semiconductor switching elements 5, the inductance of the control wirings (11a) in the power semiconductor module 1 is reduced.

(2) each of the wirings of the control electrodes 8 in the power semiconductor module 1 has the equal electric length (resistance and inductance).

Accordingly, the power semiconductor module provides versatility in the arrangement of the control electrode of each of the plurality of semiconductor switching elements therein, and concurrently, provides a highly equalized operation of the plurality of semiconductor switching elements therein.

Fourth Embodiment

Figure 8:
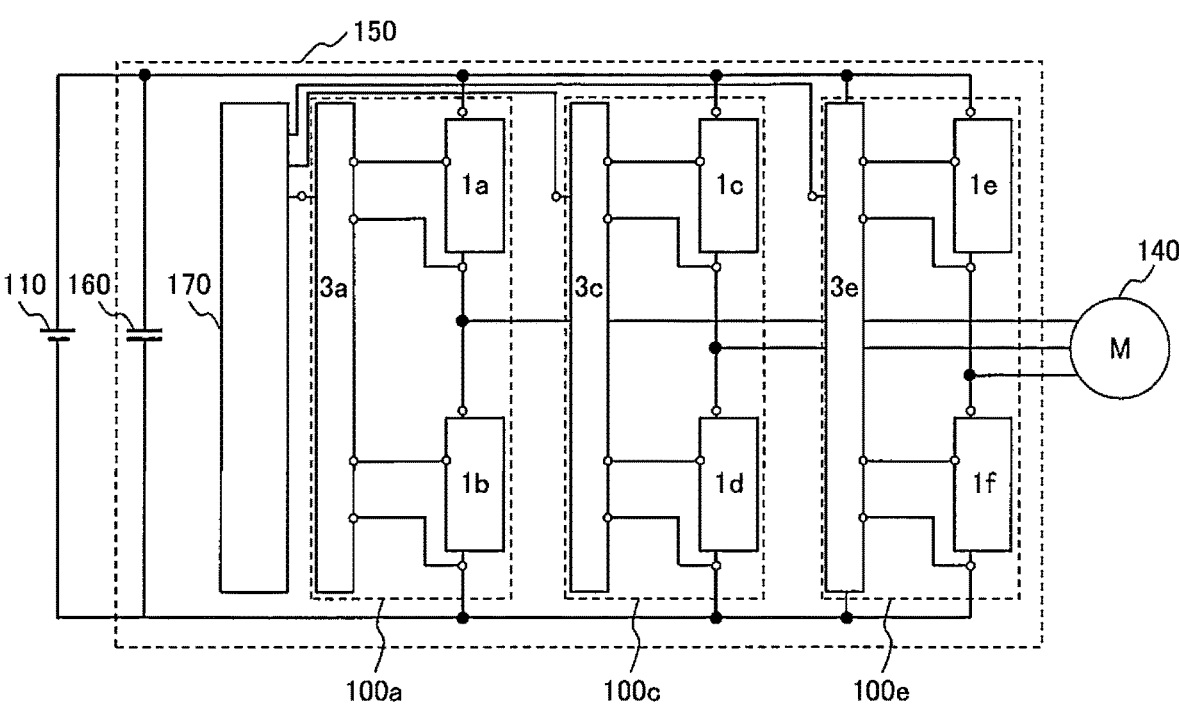
FIG. 8 is a block circuit diagram of a power conversion device according to a fourth embodiment of the present invention.

A power conversion device according to a fourth embodiment of the present invention will be described with reference to FIG. 8. FIG. 8 is a block circuit diagram of the power conversion device according to this embodiment.

FIG. 8 illustrates an example of a three-phase AC motor configured to drive an axle of an electric vehicle including a battery 110, a power conversion device 150, and an electric motor 140 as a load.

The power conversion device 150 of this embodiment includes three of leg circuits (each corresponding to one of the three AC phases), a capacitor 160, and a control circuit 170. Each of the leg circuits includes an upper arm and a lower arm including two of power semiconductor modules 1 (1a and 1b, 1c and 1d, or 1e and 1f). The power conversion device 150 includes three of leg circuits 100a, 100c, and 100e, equivalent to the number of the AC phases.

The power conversion device 150 holds a main voltage (Vcc) using the capacitor 160, and causes the control circuit 170 to generate and input a control signal to each of gate drive circuits 3a, 3c, and 3e configured to drive the gate electrode of the semiconductor switching element 5 in the corresponding power semiconductor module 1.

The leg circuits 100a, 100c, and 100e respectively correspond to a first-phase inverter leg, a second-phase inverter leg, and a third-phase inverter leg. An output of each of the first-phase inverter leg, the second-phase inverter leg, and the third-phase inverter leg is connected to the electric motor 140.

In this embodiment, the leg circuits 100a, 100c, and 100e have the same circuit configuration. With the leg circuit 100a as an example, a circuit configuration will be described below.

The leg circuit 100a includes a pair of the upper and lower arms in the power semiconductor modules 1a and 1b that are connected in series to each other, and the gate drive circuit 3a configured to perform on and off control of the power semiconductor modules 1a and 1b.

In this embodiment, the power conversion device 150 includes the power semiconductor module 1 (i.e., 1a, 1b, 1c, 1d, 1e, and 1f) to which the power semiconductor module according to any one of the first to third embodiments is applied. With the power semiconductor module according to the first or second embodiment, it is possible to reduce size of the power conversion device 150 and thus to reduce size of a motor drive system for electric vehicle including the power conversion device 150.

Concurrently, the gate wiring inductance in the power semiconductor module 1 is reduced, so that compared with the configuration of the conventional power semiconductor module, it is possible to drive the power semiconductor module 1 while receiving a stable gate drive waveform.

Accordingly, it is possible to reduce the size of the power conversion device 150 and the size of the motor drive system for electric vehicle including the power conversion device 150, or possible to prevent operational faults thereof.

It should be noted that the present invention is not limited to the foregoing embodiment, and various modifications may be included. For example, a detailed description of the foregoing embodiments is to be considered in all respects as merely illustrative for convenience of description, and thus is not restrictive. Additionally, a configuration of an embodiment may be partially replaced with and/or may additionally include a configuration of other embodiments. Further, any addition, removal, and replacement of any other configurations may be partially made to, from, and with the configuration in each of the foregoing embodiments.

For example, dimensions and the insulation distance of the members or components of the power semiconductor module 1 may vary in accordance with the applications. Further, the arrangement of the chips of the semiconductor switching elements included in the power semiconductor module 1 is not limited to the layout diagrams in the foregoing embodiments.

The power semiconductor module 1 included in the upper and lower arms may be, in addition to the MOSFET, a unipolar device such as a junction field effect transistor (JFET), or a bipolar device such as an insulated gate bipolar transistor (IGBT). Here, with some of the devices, the main terminal is referred to as a "collector" and an "emitter", in addition to the "drain" and the "source" as has been described above.

In addition to 1-in-1 configuration using one power semiconductor module 1 according to the embodiments and 2-in-1 configuration using two power semiconductor modules 1, the configuration of the power semiconductor module may be a three-phase full bridge circuit in which six or more of the power semiconductor modules 1 are mounted.

The power conversion device including the power semiconductor module 1 may be applied to a power conditioning system (PCS) in a solar power generator, a railway vehicle electrical system, or others, in addition to the motor drive system for electric vehicles.

REFERENCE SIGNS LIST

1, 1a, 1b, 1c, 1d, 1e, 1f power semiconductor module
3, 3a, 3c, 3e gate drive circuit
4 gate lead-out portion
5 semiconductor switching element
6 electrode (drain electrode)
7 electrode (source electrode)
8 control electrode (gate electrode)
9, 9a, 9b, 9c, 9d semiconductor switching element group
10 insulation substrate
11 conductive layer
11a conductor pattern (configured to connect drain electrode to upper conductive element of lower insulation substrate)
11b conductor pattern (configured to connect gate electrode to upper conductive element of lower insulation substrate)
12 insulation layer
13 conductive layer
20 insulation substrate
21 conductive layer
22 insulation layer
23 conductive layer
23a conductor pattern (configured to connect source electrode to lower conductive element of upper insulation substrate)
23b conductor pattern (configured to connect gate electrode to lower conductive element of upper insulation substrate)
31 conductor with spacer function (for source electrode)
32, 32a conductor with spacer function (for gate electrode)
33 inter-conductor wiring portion (for gate electrode)
34 insulator (for conductor with spacer function)
35 bonding wire
51 routing structure of control wiring according to the present invention
52 routing structure of control wiring according to conventional techniques
53 gate wiring current
54 source wiring return current
100, 100a, 100c, 100e leg circuit
110 battery
140 electric motor
150 power conversion device
160 capacitor
170 control circuit
The invention claimed is:

1. A power semiconductor module comprising:
a first insulation substrate;
a plurality of semiconductor switching elements arranged on the first insulation substrate;
a second insulation substrate arranged opposite the first insulation substrate across the plurality of semiconductor switching elements;
a plurality of first conductors with spacer functions and a plurality of second conductors with spacer functions arranged between the plurality of semiconductor switching elements and the second insulation substrate, each of the plurality of first conductors and the plurality of second conductors serving as a spacer between a corresponding one of the plurality of semiconductor switching elements and the second insulation substrate; and an inter-conductor wiring portion formed integrally with each of the plurality of second conductors and configured to electrically connect the plurality of second conductors to each other, wherein each of the plurality of semiconductor switching elements includes a first electrode, a second electrode arranged opposite the first electrode, and a control electrode arranged opposite the first electrode, the first electrode is electrically connected to a first conductive layer of the first insulation substrate, the second electrode is electrically connected to a second conductive layer of the second insulation substrate through a corresponding one of the plurality of first conductors, the control electrodes are electrically connected to each other through the plurality of second conductors and the inter-conductor wiring portions, and each of the inter-conductor wiring portions is arranged opposite at a predetermined distance from the second conductive layer in a direction perpendicular to a plane of the second insulation substrate.

2. The power semiconductor module according to claim 1, wherein the control electrodes are electrically connected to each other through the plurality of second conductors and the inter-conductor wiring portions, and each of the control electrodes is electrically connected to a third conductive layer of the second insulation substrate through a corresponding one of the plurality of second conductors.

3. The power semiconductor module according to claim 1, further comprising an insulation layer between the plurality of second conductors and the second conductive layer, the insulation layer serving, together with each of the plurality of second conductors, as a spacer between the plurality of semiconductor switching elements and the second insulation substrate.

4. The power semiconductor module according to claim 1, wherein the predetermined distance corresponds to an insulation distance where the inter-conductor wiring portion is electrically insulated from the second conductive layer.

5. The power semiconductor module according to claim 1, wherein each of the control electrodes is electrically connected to the corresponding one of the plurality of second conductors through a bonding wire.

6. The power semiconductor module according to claim 1, wherein the inter-conductor wiring portion forms a mutual inductance between the inter-conductor wiring portion and the second conductive layer, the mutual inductance determined based on a negative coupling coefficient between the inter-conductor wiring portion and the second conductive layer.

7. The power semiconductor module according to claim 6, wherein the coupling coefficient between the inter-conductor wiring portion and the second conductive layer is equal to or greater than −1.0 and equal to or smaller than −0.8.

8. The power semiconductor module according to claim 1, wherein each of the plurality of semiconductor switching elements is a metal-oxide-semiconductor field-effect transistor (MOSFET) element, and the first electrode corresponds to a drain electrode, the second electrode corresponds to a source electrode, and the control electrode corresponds to a gate electrode.

9. The power semiconductor module according to claim 8, wherein each of the plurality of semiconductor switching elements is a silicon carbide (SiC)-MOSFET element.

10. A power conversion device comprising:

a main circuit including one or more pairs of upper and lower arms; and a drive circuit configured to drive the one or more pairs of upper and lower arms, wherein each of the one or more pairs of upper and lower arms includes the power semiconductor module according to claim 1.

* * * * *